United States Patent [19]

Stifter

[11] 4,127,847
[45] Nov. 28, 1978

[54] MONITORING SYSTEM FOR AIRCRAFT MASTER SWITCH

[76] Inventor: Francis J. Stifter, 171 S. Main St., Natick, Mass. 01760

[21] Appl. No.: 757,614

[22] Filed: Jan. 7, 1977

[51] Int. Cl.² ............................................. G08B 21/00
[52] U.S. Cl. ................................... 340/530; 340/654; 340/27 R
[58] Field of Search ............... 340/253, 248, 252, 256, 340/280, 282, 25, 27 R

[56] References Cited

U.S. PATENT DOCUMENTS

| | | | |
|---|---|---|---|
| 742,547 | 10/1903 | Wright et al. | 340/282 |
| 1,649,011 | 11/1927 | Bakken | 340/282 |
| 1,805,999 | 5/1931 | Schleicher et al. | 340/282 |
| 2,662,942 | 12/1953 | Winkler | 340/282 X |
| 2,788,517 | 4/1957 | Smoot et al. | 340/282 X |
| 3,200,390 | 8/1965 | Eckert, Jr. et al. | 340/248 A |
| 3,349,386 | 10/1967 | Zug | 340/249 |
| 3,746,880 | 7/1973 | Fritani et al. | 340/248 R X |
| 3,794,989 | 2/1974 | Manley et al. | 340/256 X |
| 3,836,901 | 9/1974 | Matto et al. | 340/280 |
| 3,999,175 | 12/1976 | Thibodean | 340/256 X |

Primary Examiner—John W. Caldwell, Sr.
Assistant Examiner—Daniel Myer
Attorney, Agent, or Firm—John E. Toupal

[57] ABSTRACT

An electrical system for use on aircraft and including a manually operated master switch for connecting a d.c. power supply to a supply bus that feeds electrical equipment on the aircraft. Energized by the supply bus is a monitor having a delayed output that activates an alarm indicating a closed condition of the master switch. The monitor is disabled by a sensing circuit that responds to the presence of electrical pulses generated on the bus by the aircraft's alternator. Upon a failure to open the master switch after the aircraft's engine has been stopped, the absence of alternator charging pulses on the bus prevents the sensor from de-activating the monitor which after a predetermined time delay energizes the alarm to warn the pilot of the condition that would result in discharging of the battery.

9 Claims, 1 Drawing Figure

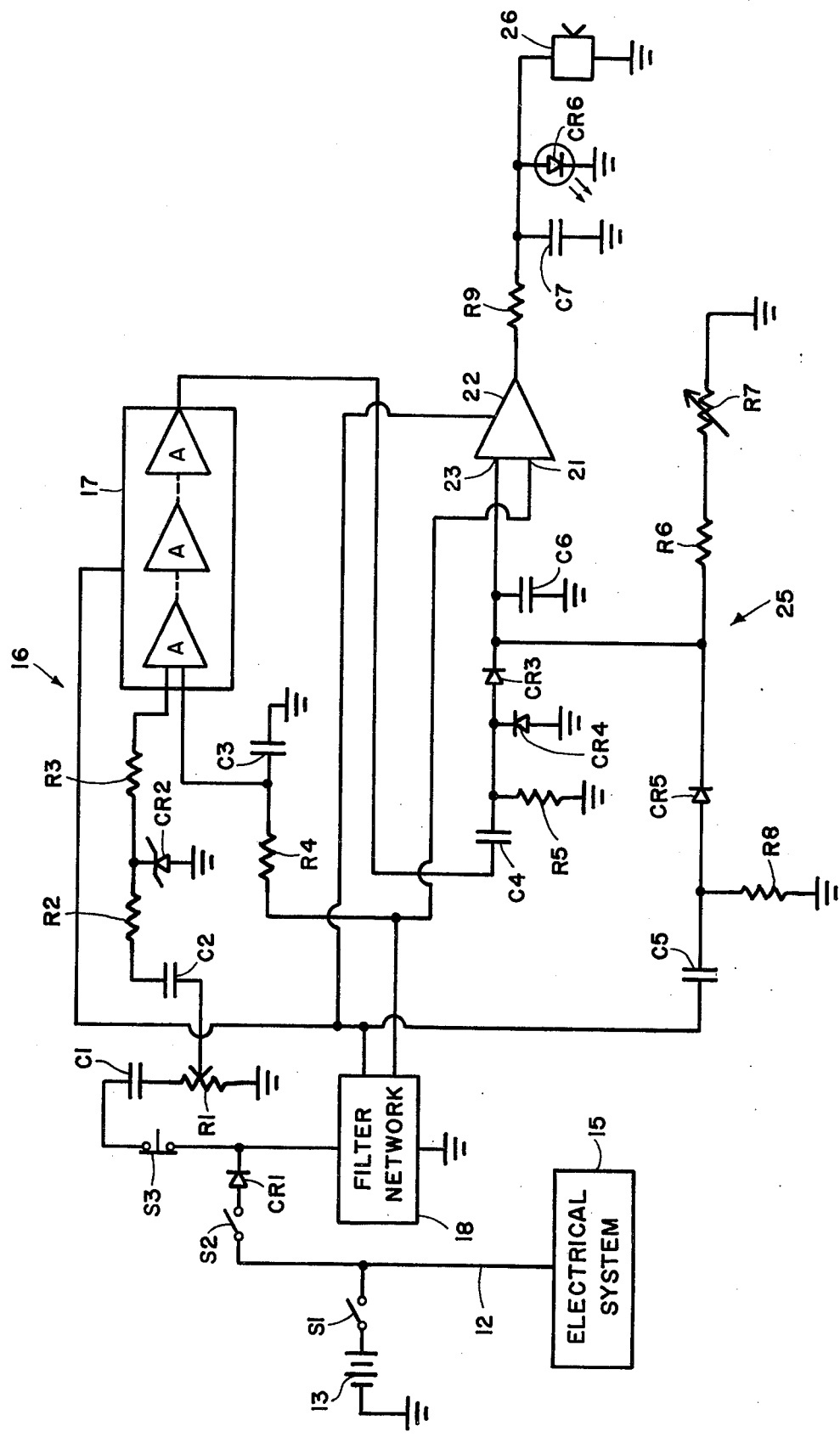

MONITORING SYSTEM FOR AIRCRAFT MASTER SWITCH

BACKGROUND OF THE INVENTION

This invention relates generally to an electrical system for aircraft and, more particularly, to a system that produces an alarm upon a failure to turn off the system's master switch after the aircraft's engine has been stopped.

In the interest of reliability, aircraft engines employ magnetos to produce the electrical energy necessary to operate their internal combustion engines. However, other apparatus utilized by aircraft including instruments, radio equipment, lighting, etc., are normally operated by a battery powered electrical system. Consequently, many planes possess both a magneto de-activation switch for interrupting engine operation and a master switch for controlling the flow of power between a battery and the plane's electrical system. For this reason pilots often neglect to turn off the master switch after having terminated engine operation with the magneto switch. The current drain established through the closed master switch causes the plane's battery to quickly discharge so as to require recharging before a subsequent flight can be made.

SUMMARY OF THE INVENTION

The invention is an electrical system for use on aircraft and including a manually operated master switch for connecting a d.c. power supply to a supply bus that feeds electrical equipment on the aircraft. Energized by the supply is a monitor having a delayed output that activates an alarm indicating a closed condition of the master switch. The monitor is disabled by a sensing circuit that responds to the presence of electrical pulses generated on the bus by the aircraft's alternator. Upon a failure to open the master switch after the aircraft's engine has been stopped, the absence of alternator charging pulses on the bus prevents the sensor from de-activating the monitor which after a predetermined time delay energizes the alarm to warn the pilot of the condition that would result in discharging of the battery.

In a featured embodiment of the invention, the alarm delay is established by a capacitor that is initially charged by energization of the bus to maintain an operational amplifier in a no-alarm condition and then discharged by a resistor network in a predetermined time period to thereby switch the amplifier into an alarm output condition. An isolation network isolates the delay capacitor from the d.c. voltage on the bus during steady state conditions so as to maintain it in a discharged condition in the absence of charging current supplied by a rectifier in response to the presence of pulses on the bus. Provisions are made for adjusting both the sensitivity of the sensor to the pulse level on the bus and the delay period required before activation of the alarm.

DESCRIPTION OF THE DRAWINGS

These and other objects and features of the present invention will become more apparent upon a perusal of the following description taken in conjunction with the accompanying drawing which is a schematic circuit diagram of the invention.

DESCRIPTION OF THE PREFERRED EMBODIMENT

Referring now to the drawing there is shown a supply bus 12 that is connected to a d.c. power supply 13 by a manually operated master switch S1. Connected to the bus 12 is a conventional aircraft electrical system 15 typically including flight instruments, radio equipment, lighting and an alternator driven by the aircraft's engine. Also connected to the bus 12 by a manual switch S2 and a rectifier CR1 is a warning system 16. Included in the system 16 is an amplifier network 17 one input of which is connected to the rectifier CR1 by a momentary switch S3, a capacitor C1, an adjustable resistor R1, a capacitor C2 and a pair of resistors R2 and R3. Overvoltage protection for the amplifier network 17 is provided by a zener diode CR2 connected between ground and the junction between the resistors R2 and R3.

Also connected to the diode CR1 is a filter network 18 that provides a second input to the amplifier network 17 via a resistor R4 and a capacitor C3. That output of the filter network 18 is applied also to one input 21 of an operational amplifier 22. The other input 23 of the amplifier 22 is connected to the output of the amplifier network 17 by a capacitor C4 and a rectifier CR3. The parallel combination of a resistor R5 and a rectifier CR4 is connected between ground and the junction between the capacitor C4 and the diode CR3. Another output of the filter network 18 supplies power to the amplifier network 17, the amplifier 22 and an isolation and delay network 25. Included in the network 25 are a capacitor C5, a diode CR5, a resistor R6 and an adjustable resistor R7. Also included in the network 25 are a resistor R8 connected between ground and the junction between the capacitor C5 and the diode CR5 and a delay capacitor C6 connected between ground and the input 23 of the amplifier 22. Receiving the output of the amplifier 22 through a resistor R9 is a parallel combination of a capacitor C7, light emitting diode CR6 and an electrically operated buzzer 26.

In response to closing of the master switch S1 and assuming prior closure of the switch S2, the inverting input 23 of the amplifier 22 is pulled positive through the capacitor C5 and the diode CR5. In addition, the delay capacitor C6 is charged positive. After initial charging, the capacitor C6 slowly drains off through the resistors R6 and R7 because of the steady state d.c. isolation provided by the capacitor C5. After a predetermined delay period, the voltage level provided by the capacitor C6 on the input 23 falls below the level on the input 21 causing a rise in the output of the amplifier 22 and energization of the alarm light CR6 and the buzzer 26.

However, if the aircraft's engine is started during the delay period, charging pulses from the plane's alternator are produced on the supply bus 12. These voltage pulses are amplified by the amplifier network 17 the output of which is applied to the voltage clamp CR4 and the rectifier CR3. Rectification of the pulses maintains a charge on the delay capacitor C6 to prevent the output of the amplifier 22 from rising and thereby also prevent activation of the alarm light CR6 and the buzzer 26.

Upon an interruption of engine operation, charging pulses from the plane's alternator cease to appear on the supply bus 12. Consequently, the amplifier network 17 produces no amplified pulses for maintaining a charge on the delay capacitor C6. As noted above, therefore, the capacitor C6 slowly drains off through the resistors R6 and R7 causing the output of the amplifier 22 to rise and energize the alarms CR6 and 26 reminding the operator that the master switch S1 has not been opened. Assuming that the master switch S1 is opened during the delay period, power is removed from the alarm system 16 and no alarm is sounded.

The adjustable resistor R1 permits a sensitivity adjustment of the signal fed to the amplifier network 17. With a suitable setting of the resistor R1, gyros, radios and other electrical equipment do not inject onto the supply bus 12, a sufficient noise level to prevent discharge of the capacitor C6 and energization of the alarms CR6 and 26. Similarly, the adjustable resistor R7 is used to adjust the delay period between engine shutdown and alarm activation. The momentary switch S3 can be actuated to eliminate signal input to the amplifier network 17 and thereby test the integrity of the alarm system.

Obviously, many modifications and variations of the present invention are possible in light of the above teachings. It is to be understood, therefore, that the invention can be practiced otherwise than as specifically described.

What is claimed is:

1. Electrical apparatus for use on aircraft and comprising:
    a supply bus for electrical equipment on the aircraft;
    a d.c. power supply;
    manual switch means for connecting said supply bus and said d.c. power supply;
    monitor means connected to said supply bus and adapted to produce an output in response to energization thereof by said d.c. power supply;
    alarm means energized by said output from said monitor means; and
    sensing means for preventing said output in response to the presence of electrical pulses on said bus.

2. Electrical apparatus according to claim 1 wherein said sensing means comprises delay means for preventing said output for a predetermined time period after energization of said bus by said d.c. power supply.

3. Electrical apparatus according to claim 2 wherein said delay means comprises capacitor means initially charged in response to energization of said bus, and resistor means for draining the charge from said capacitor means during said predetermined time period.

4. Electrical apparatus according to claim 3 wherein said monitor means comprises operational amplifier means activated to produce said output in response to a given reduction in the voltage level across said capacitor means.

5. Electrical apparatus according to claim 4 including isolation means providing steady state d.c. isolation between said bus and said capacitor means.

6. Electrical apparatus according to claim 5 including rectifier means for coupling charging current to said capacitor means in response to the presence of said pulses on said bus, said charging current preventing said given reduction in the voltage level across said capacitor means.

7. Electrical apparatus according to claim 6 including an alternator associated with an engine on the aircraft and effective to produce said electrical pulses on said bus.

8. Electrical apparatus according to claim 7 including sensitivity adjustment means for adjusting the pulse level required by said sensing means to prevent said output.

9. Electrical apparatus according to claim 8 including delay adjustment means for adjusting the length of said predetermined time period.

* * * * *